United States Patent
Dagenais et al.

(10) Patent No.: US 6,506,672 B1
(45) Date of Patent: Jan. 14, 2003

(54) RE-METALLIZED ALUMINUM BOND PAD, AND METHOD FOR MAKING THE SAME

(75) Inventors: Mario Dagenais, Chevy Chase, MD (US); Scott A. Merritt, Pinner (GB); Madhumita Datta, College Park, MD (US)

(73) Assignee: University of Maryland, College Park, College Park, MD (US)

( * ) Notice: Subject to any disclaimer, the term of this patent is extended or adjusted under 35 U.S.C. 154(b) by 0 days.

(21) Appl. No.: 09/608,138

(22) Filed: Jun. 30, 2000

Related U.S. Application Data

(60) Provisional application No. 60/141,662, filed on Jun. 30, 1999.

(51) Int. Cl.$^7$ .............................................. H01L 21/44
(52) U.S. Cl. ...................... 438/612; 438/90; 438/113; 438/270; 438/301; 438/615
(58) Field of Search .................................. 438/612, 113, 438/90, 301, 270, 615

(56) References Cited

U.S. PATENT DOCUMENTS

| | | | | |
|---|---|---|---|---|
| 4,132,813 | A | * 1/1979 | Schaal | 427/90 |
| 6,043,125 | A | 3/2000 | Williams et al. | 438/270 |
| 6,169,021 | B1 | * 1/2001 | Akram et al. | 468/612 |
| 6,184,098 | B1 | * 2/2001 | Noguchi | 438/301 |
| 6,281,046 | B1 | * 8/2001 | Lam | 438/113 |

* cited by examiner

Primary Examiner—Richard Elms
Assistant Examiner—Pho M. Luu
(74) Attorney, Agent, or Firm—Sterne, Kessler, Goldstein & Fox P.L.L.C.

(57) ABSTRACT

A electroless plating method re-metallizes aluminum bond pads so that the re-metallized bond pads include layers of aluminum, zinc, nickel, and gold. The re-metallized bond pads are wire-bondable and solder wettable, and therefore can be flip-chip bonded. Applications include the realization of hybrid smart pixel arrays for optical interconnections, where an optical transmitter and optical detector are flip-chip bonded directly to respective CMOS driver chips.

3 Claims, 11 Drawing Sheets

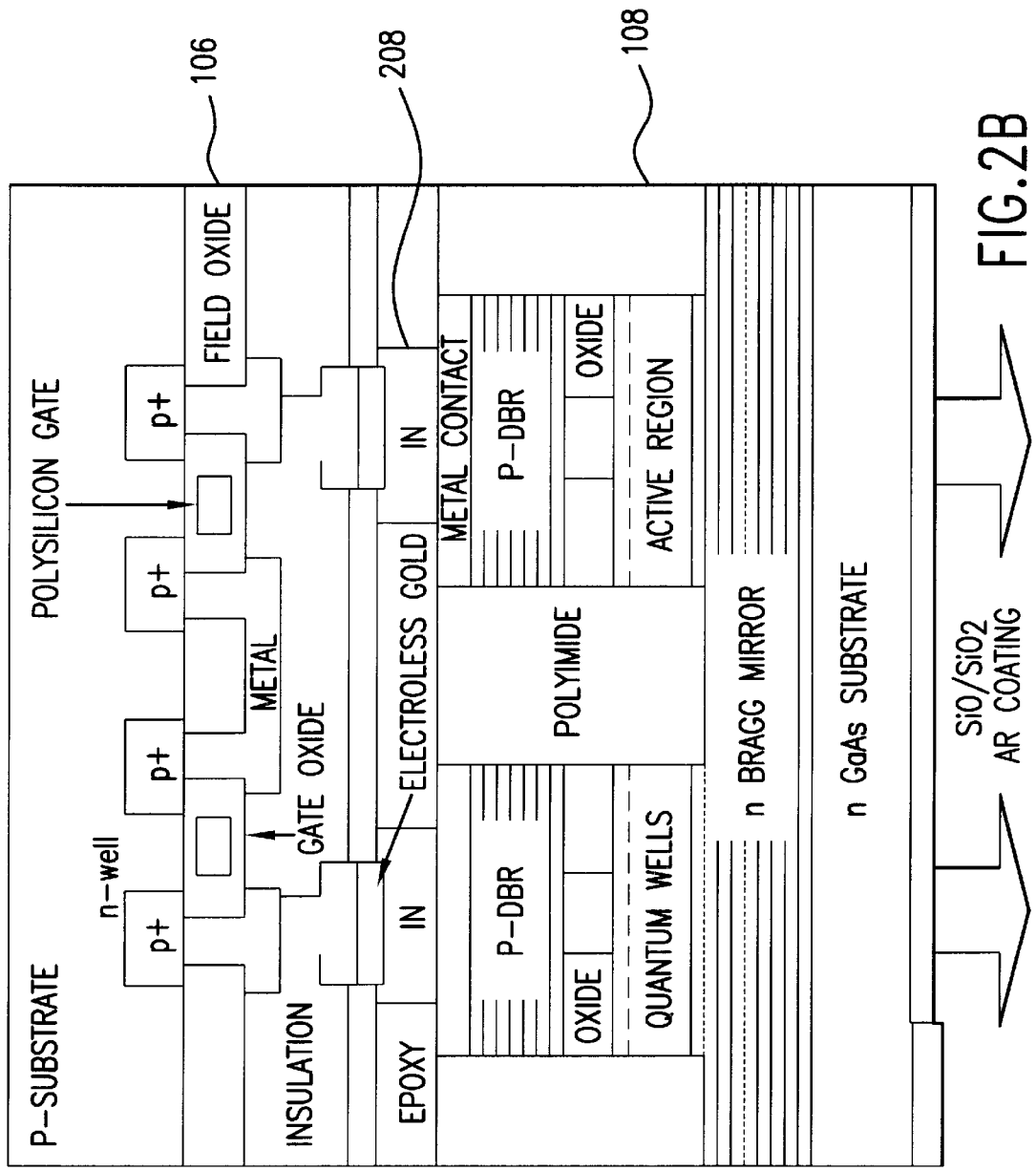

Double Zincation 760x    20.0 kV    10μm

Double Zincation (MOSIS)

1,500x    20.0 kV    10μm

RE-METALLIZED ALUMINUM BOND PAD, AND METHOD FOR MAKING THE SAME

This application claims the benefit of U.S. Provisional Application No. 60/141,662, filed on Jun. 30, 1999.

The U.S. Government has a paid-up license in this invention and the right in limited circumstances to require the patent owner to license others on reasonable terms as provided for by the terms of NSF EEC 9520255 awarded by NSF.

BACKGROUND OF THE INVENTION

1. Field of the Invention

The invention is generally related to semiconductor processing. More particularly, the invention is related to re-metallizing aluminum bond pads on a semiconductor integrated circuit so that the re-metallized bond pads are solder-wettable.

2. Related Art

Cost-effective integration and packaging are the keys to the successful commercialization of electronic and optoelectronic components in large-volume markets.

Wire-bonding is one well known technique for forming an electrical connection between two semiconductor integrated circuits (ICs). During wire-bonding, metal electrodes (called bond pads) on the respective semiconductor ICs are electrically connected together using very small diameter wires (called bond wires) that are typically made of gold. Example diameters of bond wires are approximately 20–25 um. Since the bond wires are very thin, the length of the bond wires should be kept relatively short in order to prevent parasitic reactances from affecting the circuit performance. Additionally, the bond wires are fragile and cannot be relied on to provide a mechanically rigid connection between the semiconductor ICs.

Another well known integration technique is called "flip-chip" bonding. In flip-chip bonding, two semiconductor ICs having matching bond pad patterns, are soldered together by re-flowing solder bumps that are attached to the bond pads of one of the ICs. During flip-chip bonding, one of the ICs is "flipped" upside down and aligned with the matching bond pad pattern on the second IC. After which, the solder bumps are re-flowed to perfect the electrical and mechanical connection between the matching bond pad patterns on the two semiconductor ICs.

Flip-chip bonding has multiple advantages over wire-bonding, assuming there are matching bond pad patterns on the semiconductor ICs. For example, flip-chip bonding takes advantage of self-aligning properties of solder, which can compensate for IC misalignment up to a few microns. Additionally, all of the solder connections are re-flowed simultaneously, instead of individually. Additionally, flip chip bonding provides a rigid mechanical connection between the two semiconductor ICs. Finally, flip-chip bonding eliminates the parasitics associated with the long bond-wires that are used in wire-bonding.

Despite the advantages of flip-chip bonding, most silicon CMOS chips that are produced by commercial foundries have bond pads that are made of sputtered aluminum alloys, such as Al/Si/Cu(98%, 1%, 1%). These aluminum alloys are not solder-wettable, and therefore cannot be flip-chip bonded without modification.

Therefore, what is needed is a process for re-metallizing aluminum alloy bond pads so that the bond pads are solder-wettable, and can be flip-chip bonded.

SUMMARY OF THE INVENTION

The present invention is directed to a re-metallized aluminum bond pad on a semiconductor integrated circuit (IC), and a method or process of making the same. The re-metallized bond pad includes the following layers: the original aluminum layer, a zinc layer, a nickel layer, and a gold layer. The re-metallized bond pad is both wire-bondable and solderable, and can be flip-chip bonded.

The re-metallization process is an electroless plating process that re-metallizes the aluminum pads with gold. The process works selectively on the aluminum pads only, without being detrimental to the underlying silicon circuitry that is typically protected by a passivation layer.

The first step of the re-metallization process is to pre-clean the aluminum bond pad to remove dust and wafer processing residue. The pre-cleaning can be done with organic solvents, including TCA, Acetone, and Methanol.

The next step of the re-metallization process is to de-oxidize the aluminum bond pad to remove the native oxide layer. This can be done by micro-etching the aluminum bond pad in an acid solution. The concentration and immersion time can be varied to adjust the roughness of the resulting de-oxidized aluminum surface.

The next step in the re-metallization process is to deposit a layer of zinc on the de-oxidized aluminum using an alkaline zincate solution. Preferably, the zinc layer is applied in two zincate treatments, called "double zincation." A first seed layer is applied immediately after de-oxidizing the aluminum bond pad, to prevent the aluminum bond pad from re-oxidizing. The second zinc treatment is performed after "desmutting" the IC in nitric acid. Double zincation is preferred over single zincation, because the intermediate de-smutting step strips the granulated initial zinc deposit, and produces a more uniform zinc film over the surface of the bond pad. Additionally, superior uniformity in surface coverage and grain size has been achieved by raising the temperature of the zincate solution to a range of 38–42 degrees C. during immersion. In contrast, the manufacturer of the zincate solution suggests a temperature of 25 C, or room temperature.

The next step in the re-metallization process is to deposit a layer of nickel onto the zinc layer using an electroless process. The nickel layer seals the aluminum surface as a solder diffusion barrier layer, and also provides hardness, mechanical strength, and solderability to the bond pad.

The final step in the re-metallization process is to deposit a layer of gold onto the nickel layer using an immersion process and/or an autocatalytic process. The gold layer protects the re-metallized bond pad from oxidation, and improves solderability and wire-bondability.

The re-metallizing process is a low-cost and efficient technique for re-metallizing aluminum bond pads. The process is low cost because the electroless plating solutions that are utilized are readily available in the commercial market. Additionally, no electric current source is necessary because all the solutions and steps are electroless. Additionally, the number of steps in the process cycle have been minimized by selecting advantageous combinations of chemical reagents. Potentially hazardous steps, like cyanide zinc pre-treatment and cyanide autocatalytic gold plating are replaced with benign alternative processes.

Another advantage of the invention is that the re-metallized aluminum/gold bond pads are still wire-bondable. In other words, the re-metallized bond pads are suitable for both flip-chip solder bonding, and manual wire-bonding applications. This results in cost and time savings during hybrid assembly. Additionally, no additional masking or lithographic processing is utilized to protect the bond pads in order to insure wire-bondability.

BRIEF DESCRIPTION OF THE FIGURES

FIG. 2b is a diagram of a cross-sectional view of the flip-chip bonded VCSEL die and CMOS driver chip, according to embodiments of the invention;

DETAILED DESCRIPTION OF THE PREFERRED EMBODIMENTS

1. Overview of the Invention

Figure 1:
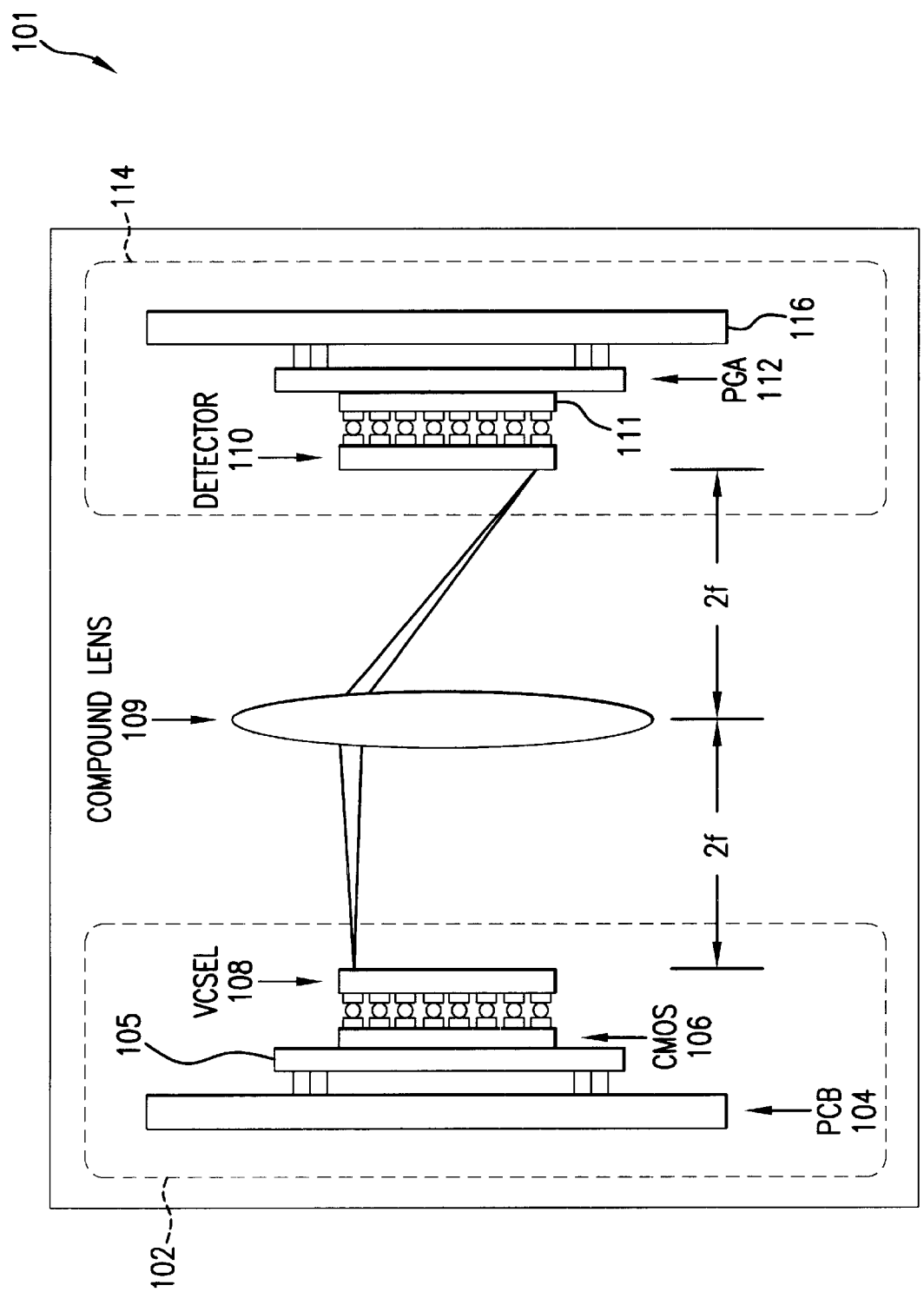
FIG. 1 illustrates an optical interconnect containing a flip-chip bonded pair including an optical transmitter and receiver, according to embodiments of the invention.

Aluminum is the metal of choice for epitaxial layer connections and top-layer bond pad metal in IC devices because of its superior electrical and thermal conductivity, low cost, wire-bondability, and other performance and reliability factors. However, aluminum is not solder-wettable, because it oxidizes readily in air, and hence is not suitable for flip-chip solder bonding. (Throughout this application, the term aluminum is meant to include pure aluminum, and aluminum based alloys.)

The present invention is an electroless plating process that re-metallizes aluminum pads with gold. Gold is solder bondable and wire-bondable. The process works selectively on the aluminum pads only, without being detrimental to the underlying silicon circuitry that is typically protected by a passivation layer.

Electroless plating has the highest potential for cost reduction of the bond-pad coating processes. This occurs because the process provides a selective autocatalytic metal deposition directly on the aluminum pads of a CMOS chip, without requiring costly equipment for photoresist-imaging or sputtering. Furthermore, electroless plating is more cost effective than electroplating, because no external current is required. During the electroless process, metal is deposited by chemical reduction reaction from an aqueous solution of the metallic salt, where the deposition solely depends on the autocatalytic action of the plating bath. Deposition progresses almost linearly with time. One can control the plating rate by controlling the temperature, concentration, and pH of the plating bath. Furthermore, electroless plating can be done equally efficiently on a single semiconductor IC, or on a batch semiconductor ICs.

Once the electroless process is complete, the gold plated bond pads are solder wettable, and therefore can undergo solder bonding, including flip-chip bonding.

During flip-chip bonding, electrical and mechanical interconnects are formed simultaneously by re-flowing the solder bumps at suitable a temperature and pressure. Flip chip bonding is a self-aligning process. The wetting action of the solder aligns the chip's bump pattern to the corresponding solderable gold-coated substrate pads, thereby compensating for any chip-to-chip misalignment, up to a few microns.

An advantage of the invention is that the re-metallized aluminum/gold bond pads are still wire-bondable. In other words, the re-metallized bond pads are suitable for both flip-chip solder bonding, and manual wire-bonding applications. Additionally, no masking or lithographic processing is utilized to protect the bond pads that are to be wire-bonded. This results in efficiency gains and cost reduction during hybrid assembly.

2. Example Environment

Before describing the invention in detail, it is useful to describe an example environment for the invention. Description of this example environment is provided for convenience only, and is not intended to limit the invention in any way. In fact, after reading the invention description, it will become apparent to a person skilled in the relevant arts how to implement the invention in alternate environments that are different from that described herein.

Free space optical interconnects offer the following advantages for the communication of information: 3-D flexibility in packaging, high interconnection densities, high bandwidth capability, independence of interconnection length, and immunity to electromagnetic interference during the communication of information. FIG. 1 illustrates a free space optical interconnect 101 having an optical transmitter 102, an optical receiver 114, and a compound lens 109. During operation, the transmitter 102 sends information using laser light to the compound lens 108, which focuses the laser light on the receiver 114, thereby communicating information.

In embodiments, the transmitter 102 includes a Vertical Cavity Surface Emitting Laser (or VCSEL) array 108 that is driven by an electronic CMOS driver circuit 106. The array 108 and the CMOS driver circuit 106 are mounted on a pin grid array (PGA) 105, which is mounted on a PC board 104. The array 108 includes arrays of optical switches that are integrated with the corresponding CMOS logic circuitry 106. This combination is referred to as a "smart pixel array" and is one of the most important building blocks in a free-space optical interconnect system. The receiver 114 includes a laser detector 110 that is integrated with a CMOS receiver chip 111, for processing received laser light. Similar to the transmitter, the detector 110 and CMOS receiver 111 are mounted on a PGA 112, which is mounted on a PC board 116, as shown.

Figure 2A:
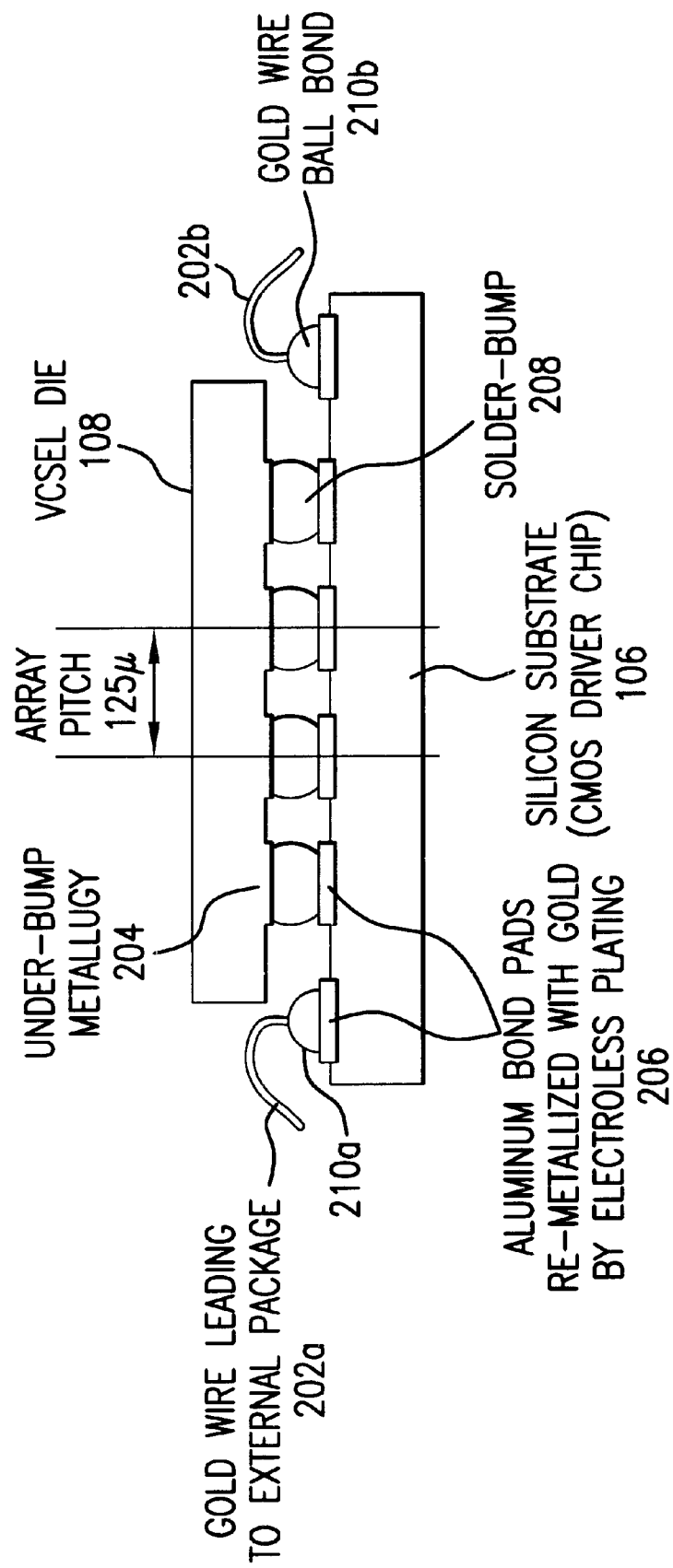
FIG. 2a is a diagram of a 4×4 VCSEL die-substrate assembly with a CMOS driver chip that is flip-chip solder bonded and wire-bonded, according to embodiments of the invention.

VCSELs have been identified as the optical source of choice in hybrid smart pixel applications because of their inherent two-dimensional geometry, which is suitable for high-density packaging. In one hybrid approach, the VCSEL array 108 is integrated with the CMOS driver chip 106 utilizing flip-chip bonding, as shown in FIG. 2a. Additionally, the detector 110 can be flip-chip bonded to the CMOS receiver 111 in a similar manner.

Referring to FIG. 2a, the VCSEL array 108 has solder bumps 208 that are attached to VSCEL bond pads 204. The CMOS driver chip 106 has aluminum-based bond pads 206. During flip-chip bonding, the VCSEL array 108 is flipped upside down so that the solder bumps 208 are aligned with the bond pads 206. Once sufficient alignment is achieved, the solder bumps 208 are re-flowed using the necessary temperature and pressure conditions to perfect the solder joint. Flip-chip bonding offers the advantage of self-aligning properties of solder, as well as the elimination of parasitics that are associated with wire-bonding.

In order for a proper solder joint to be formed, the aluminum bond pads 206 are re-metallized with gold prior to flip-chip bonding according to the electroless plating process that is described herein. Re-metallization is necessary because the aluminum bonds that are attached to commercially available ICs are not solder wettable without further processing.

FIG. 2a also illustrates bond wire 202 having a ball bond 210 to represent that the electroless plating process of the present invention is still wire-bondable. In other words, the re-metallized aluminum pads 206 that undergo the electroless plating process can still be wire-bonded after the process is complete. This assures flexibility and efficiency during post-plating hybrid assembly. Furthermore, the re-metallized pads are wire-bondable without the use of any lithographic masking techniques during plating, which can be expensive and time consuming.

FIG. 2b illustrates a partial cross section view of the various layers of the VSCEL array 108, the CMOS driver 106, and the solder bumps 208. Note that FIG. 2b is rotated 180 degrees relative to FIG. 2a, as the VCSEL array is on the bottom in FIG. 2b, instead of on top as in FIG. 2a.

3. Description of the Electroless Plating Process According to Embodiments of the Present Invention As described above, semiconductor ICs from commercial foundries typically have bond pads (also called electrodes or contacts) that are made of an aluminum alloy, such as Al/Si/Cu (98%, 1%, 1%). Aluminum alloys are not solder-wettable, and therefore cannot be utilized in flip-chip bonding without re-metallization with a metal that is solder-wettable. The electroless process described herein builds a bond pad having layers of aluminum (original bond pad), zinc, nickel, and gold. The re-metallized bond pad is both solder-wettable and wire-bondable.

In the electro-deposition of metals (including electroless and electro-plating), an aqueous solution is typically utilized because of the high solubility of most metal salts in water and the good electrical conductivity of such solutions. Metal deposition from metal salt solutions is a chemical reduction reaction in both electrolytic and electroless plating. However, electroless plating is a simpler and more elegant process, because it depends solely on the autocatalytic action of the plating bath, while electrolytic deposition is based on cathodic discharge of metal ions and requires a external electric current. Electroless plating progresses almost linearly with time, resulting in a very uniform deposition, which is crucial for achieving uniform bump height over all the elements of a bond pad array. For bond pads metallized with aluminum or sputtered aluminum alloy, the most robust re-metallizing system is nickel/gold. To initiate the electroless nickel deposition, aluminum bond pads are activated with a seed layer of zinc. Next, a layer of nickel is added for hardness and mechanical strength. The final layer of metallization is the autocatalytic gold, which ensures wire-bondability as well as solderability of the bond pad surface. The entire re-metallization process flow can be summarized in the flowchart 300 that is shown in FIG. 3, which will be referred throughout sections 3.1–3.4 that follow.

3.1 Pre-Cleaning and De-oxidizing

Figure 3:
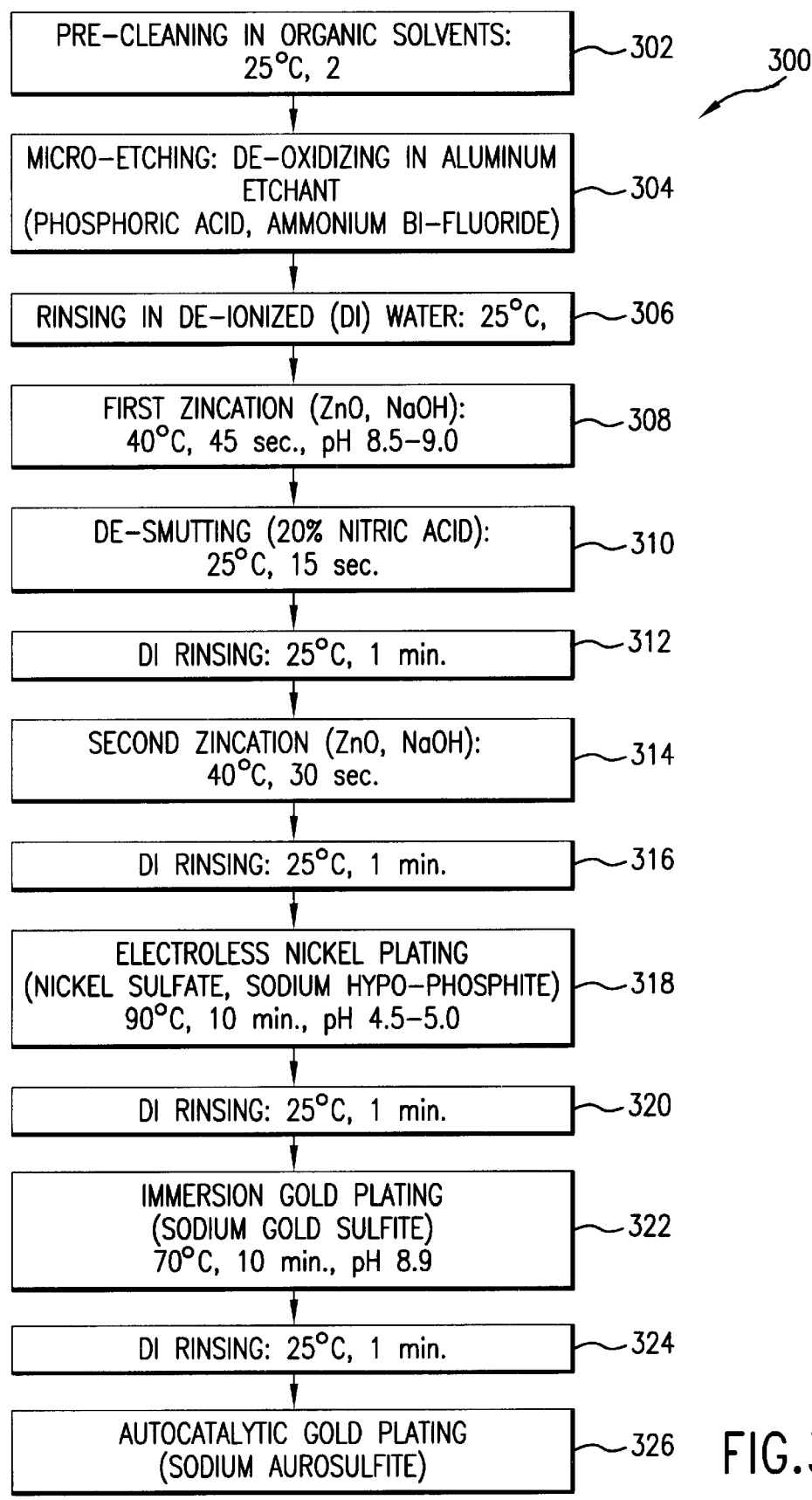
FIG. 3 illustrates a flowchart of the complete electroless re-metallization process, according to embodiments of the present invention.

Referring now to FIG. 3, in step 302, the bond pads are pre-cleaned with organic solvents that include but are not limited to: TCA, Acetone, and Methanol. Other equivalent solvents could be used as will be understood by those skilled in the arts. The bond pads need to be pre-cleaned in order to remove dust and organic residues from wafer processing and transport. Adhesion and homogeneity of electroless metal deposits suffer if the surface of the base metal is not sufficiently clean. Also, the presence of contaminants increases the contact resistance appreciably. Hence, the entire IC is rinsed thoroughly in the mentioned organic solvents, or their equivalents.

Figure 4A:
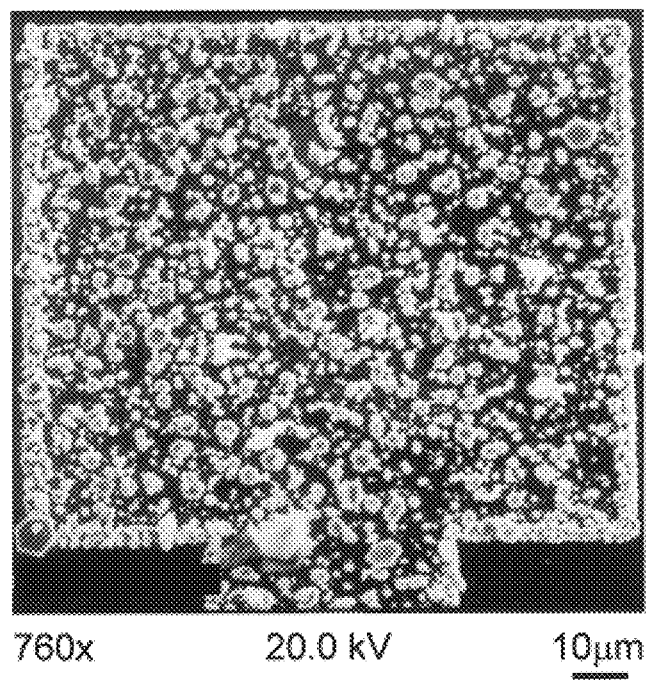
FIG. 4a illustrates a Scanning Electron Microscope (SEM) image of a highly granulated and non-uniform zinc deposit (magnification 760×), resulting from the improper removal of the native oxide layer that is associated with aluminum bond pads.
Figure 4B:
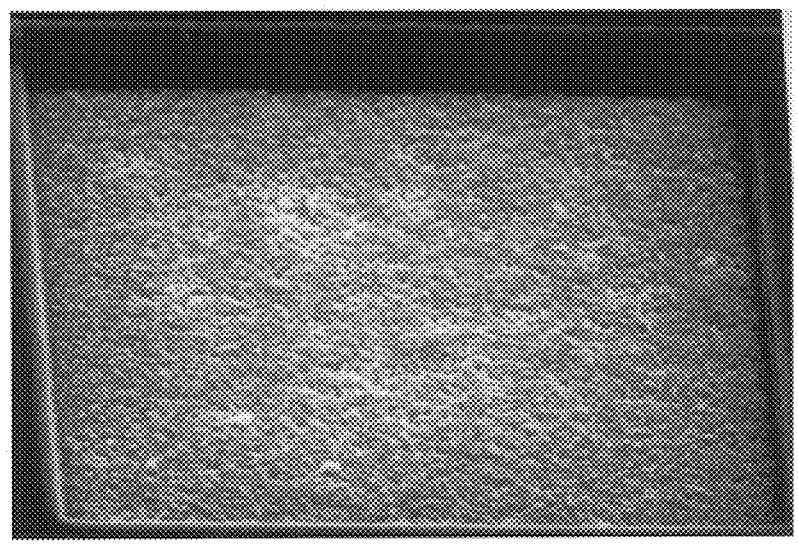
FIG. 4b illustrates a SEM image of a zincated aluminum bond pad (magnification 1,500×), where the oxide layer was properly removed prior to zincation, according to embodiments of the invention.

In step 304, the bond pads are de-oxidized to remove the native oxide layer that is associated with aluminum. This step is necessary because if the native oxide layer is not removed completely from the aluminum, the subsequent zinc deposit becomes heavily nucleated and extremely non-uniform. FIG. 4a is a Scanning Electron Microscope (SEM) image of a zinc deposit without proper oxide removal. The zinc deposit in FIG. 4a has distinct hexagonal crystals with poor overall surface coverage and very high surface roughness (~1.5 KÅ). In contrast, FIG. 4b illustrates a zinc layer deposited after proper oxide removal, and is discussed further in step 308 below.

In one embodiment, the oxide layer is removed by sputter-etching.

In an alternate embodiment, the oxide layer is removed by using a wet chemical etch. More specifically, the oxide layer is removed by micro-etching the roughness of the aluminum bond pads to an approximate range of 130–200 Å. A micro-etchant that can be utilized is an acidic liquid containing phosphoric acid (8% wt.), ammonium bi-fluoride (2% wt.), and butyl cellusolve (3% wt.). This micro-etchant combination is commercially available under the trade name "The Stuff for Aluminum", manufactured by Broco Products, Inc., and marketed by Seiler-Hughes of Baltimore, Md. The miro-etchant is aggressive enough to penetrate through the oxide barrier at room temperature (approximately 25 C). The micro-etchant only reacts with exposed aluminum pads, without attacking the $SiO_2$ passivation layer that protects the electronic circuitry. Therefore, the entire semiconductor IC can be treated with (or immersed in) the micro-etchant in an efficient manner, without utilizing any masking techniques.

The dissolution rate of aluminum in the non-diluted micro-etchant is approximately 0.1 $\mu$m/minute at room temperature. Therefore, given a bond pad having an initial thickness of 1.0 $\mu$m, the immersion time should not be more than 1 minute. If the initial thickness of the aluminum layer is less, the solution is diluted to 50% volume/volume with de-ionized (DI) water, and the etching time is also reduced accordingly. By varying the concentration and/or the etching time, the roughness of the resulting aluminum surface can be adjusted to the desired 130–200 Å range, which improves the adhesion and coverage of the subsequently applied zinc layer.

In step 306, the semiconductor IC (including the bond pads) is rinsed in de-ionized water to remove the micro-etchant, prior to the next step of zincation.

3.2 Double Zincation

In step 308, a zinc layer is formed on top of the de-oxidized aluminum bond pads using an electroless process. This is a first zincation step that forms a seed layer for a second zincation step (step 312), and prevents the aluminum bond pads from getting re-oxidized. The zinc layer is formed by immersing the semiconductor IC (and bond pads) in an alkaline zincate solution. The semiconductor IC should be immersed in the zincate solution immediately after micro-etching and DI rinsing. If the etched bond pads are exposed to air, they will reform a native oxide, preventing the proper formation of the zinc seed layer.

In embodiments, the zinc layer thickness is relatively thin, and is approximately 0.25 um. However, other thicknesses could be used, as will be understood by those skilled in the relevant arts.

In embodiments, a moderately alkaline plating solution, having the product name "Techni SBZ conditioner concentrate", is utilized as the zincate solution. "Techni SBZ conditioner concentrate" is obtained from Technic, Inc. of Cranston, R.I., and has main ingredients of zinc oxide (5% wt.) and sodium hydroxide (30% wt.). A 10% zincate solution is prepared by adding 10 ml of SBZ concentrate to 90 ml of DI water. The resulting pH of the solution is a approximately 8.5–9.0, because dissolution rate of aluminum at this pH range is minimum.

Electroless zincation is a "displacement reaction", in which aluminum ions are displaced by zinc ions, as described in the reactions below:

Anodic dissolution of aluminum:

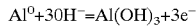
$Al^0 + 3OH^- = Al(OH)_3 + 3e^-$

Cathodic deposition of zinc:

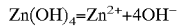
$Zn(OH)_4 = Zn^{2+} + 4OH^-$

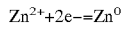
$Zn^{2+} + 2e^- = Zn^0$

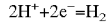
$2H^+ + 2e^- = H_2$

Immersion time is a critical factor, because the alkaline zincate bath displaces the aluminum as mentioned above. Therefore if the immersion time is too long, the whole aluminum bond pad can be displaced by the zincate solution. In embodiments, the immersion time for the first zincation step is approximately 45 seconds at a temperature of approximately between 38–42 degrees C. In a preferred embodiment, the temperature is 40 degrees C. However, other temperatures and immersion times could be used.

When done properly, zincation should produce a zinc film having a fine grain size of 0.1 um or smaller. Small grain size means better coverage and adhesion of the zinc layer and subsequent layers. Adhesion and grain size of the zinc film can be influenced by traces of additives e.g. copper, iron, nickel, etc. in the zincate bath. Micro-etching (step 304) plays an important role in determining the grain size and uniformity of the grain distribution of the zinc deposit. FIG. 4b shows the morphology of a zinc layer with proper micro-etching. The zinc film in FIG. 4b has a vastly improved surface coverage and finer grain size (0.1 $\mu$m), when compared to the zinc deposit in FIG. 4a.

Regarding the zincation solution, it is noted that Techni, Inc. (the manufacturer of Techni SBZ) recommends that zincation be done at room temperature (25 C). However, by experiment, the inventors found that the temperature range of 38–42 degrees produced a better fine grain zinc film on the aluminum alloy bond pad, as shown in FIG. 4b. Outside of the 38–42 degree temperature range, the grain size increases more toward that shown in FIG. 4a.

In step 310, the bond pads are de-smutted. More specifically, the semiconductor IC (and bond pads) are immersed in an aqueous solution of approximately 20% nitric acid at room temperature (25 C) for approximately 15 seconds. The nitric acid solution dissolves some of the first zinc layer in preparation for a second zincation treatment.

In step 312, the semiconductor IC (and bond pads) is rinsed with de-ionized water, prior to the second zincation step.

In step 314, a second zincation is performed to rebuild the zinc layer (after de-smutting) using the same type of zincation solution as in step 310. In embodiments, the zinc layer is built up to approximately 0.25 um. Double zincation is preferred over single zincation, because the intermediate "de-smutting" in nitric acid strips the granulated initial zinc deposit, resulting in a more uniform zinc film.

When "Techni SBZ" is used as the zincation solution, then the second zincation immersion is for approximately 30 seconds at the mentioned temperature range of approximately between 38–42 degrees C. As mentioned above, in a preferred embodiment, the temperature of the zincate solution is 40 degrees C.

In step 316, the semiconductor IC (and bonds pads) is rinsed with de-ionized water.

3.3 Electroless Nickel Plating

In step 318, a nickel layer is deposited on top of the zinc layer using an electroless process. The nickel layer seals the aluminum surface as a solder-diffusion barrier layer, and also provides hardness, mechanical strength and solderability to the bond pads.

Typically, two types of autocatalytic nickel plating systems are supplied by commercial vendors, based on either nickel-phosphorus (NiP) or nickel-boron (NiB). The reducing agent in Ni/P system is sodium hypophosphite, while the activator in Ni/B system is dimethyl amin borane (DMAB). In both cases, the deposit is Ni/P or Ni/B alloy rather than pure nickel. Additionally, in recent years it has been found that pure nickel deposits can be formed using gaseous hydrazine as reducing agent, though no significant practical application has been reported yet. Each of the these techniques of nickel deposition can be utilized by the present invention for nickel deposition on the zinc layer. However, the NiP based deposition is preferred because the hypophosphite based plating solutions are well-known to produce good quality of electroless nickel with a high plating rate (>0.25 um/min).

In all the aqueous electroless solutions, nickel ions (nickel chloride or nickel sulfate) and reducing agents remain in metastable equilibrium. In addition, most of the standard aqueous nickel plating bath formulations contain organic complexants (citrate or acetate), pH regulators. accelerators, stabilizers, buffers and wetting agents to inhibit the occurrence of random reduction of nickel and thereby, to improve adhesion and morphology of the deposit.

There are different theories to explain the deposition mechanism of the Ni/P alloy, viz. catalytic model involving atomic hydrogen, hydrated anion model, hypophosphite ion adsorption model etc. Essentially, nickel is deposited initially by ion-exchange or displacement reaction aided by the reducing agent. The chemical reaction is as follows:

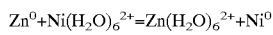

$$Zn^0 + Ni(H_2O)_6^{2+} = Zn(H_2O)_6^{2+} + Ni^0$$

Once initiated, the process autocatalyzes itself to continue nickel deposition at a more or less linear rate depending on the temperature and pH of the solution.

The Ni plating rate is ~0.3 $\mu$m/min at 90° C. on zincated aluminum using a high-phosphorus (11%) electroless nickel solution with pH adjusted to 4.5. The reagent that is utilized is a commercially obtainable electroless nickel plating solution, named Techni EN 9120, manufactured by Technic, Inc of Cranston, R.I. However, other regents could be used as will be understood by those skilled in the arts based on the discussion herein. Additionally, the temperature range for nickel plating can be performed over a range of 85–91° C., with a preferred temperature of 90 degrees C.

Techni EN 9120 is provided in two separate parts, part A and part B, which are to be combined and diluted with de-ionized water prior to their use. Part A is the source of nickel ions, such as nickel chloride and nickel sulfate. Part B is the source of hypophosphite ions, such as sodium hypophosphite. The concentration of nickel and hypophosphite in the solutions is 0.65–0.85 oz/gal and 3.2–4–5 oz/gal, respectively. The plating bath is prepared by mixing 5 ml of part A, and 15 ml of part B, with 80 ml of DI water. The optional additional step of using an "alkaline strike" prior to the nickel deposition is discarded, as it does not significantly improve the quality of the metallic deposit.

Figure 5:
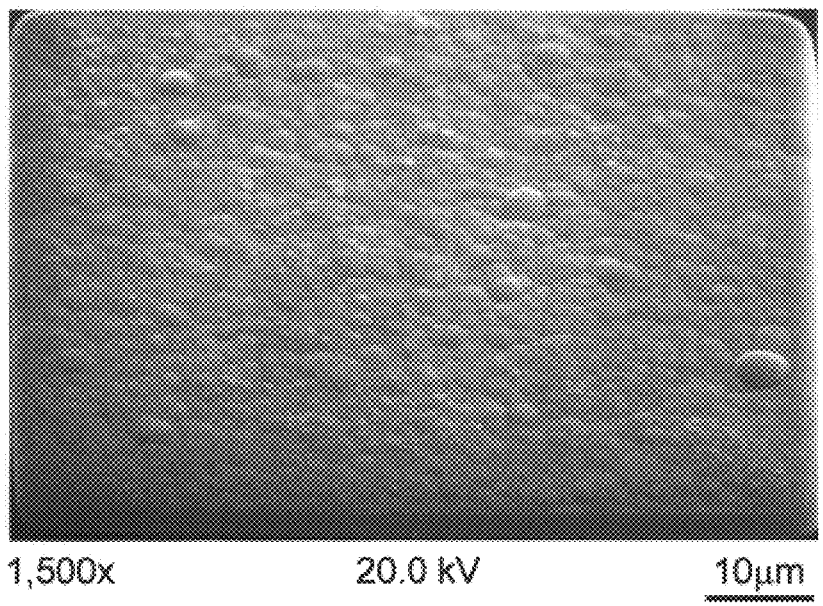
FIG. 5 illustrates a SEM image of bond pad after electroless nickel plating (magnification 1,500×), according to embodiments of the invention.

FIG. 5 illustrates an SEM photograph of a bond pad bumped with a 3.0 $\mu$m high nickel barrier using the nickel plating process described herein. Roughness of the bump surface is approximately 450 Å. Other nickel layer thicknesses could be formed and utilized, as will be understood by those skilled in the arts based on the discussion herein.

In step 320, the semiconductor IC (and bond pads) are rinsed in de-ionized water.

3.4 Immersion Gold Plating

In step 322, a layer of gold is formed on the nickel layer using an immersion process. The gold plating protects the re-metallized bond pads from oxidation and also increases solderability and wire-bondability.

In embodiments, an alkaline (pH 8.9) immersion gold bath of sodium gold sulfite is utilized, having a gold concentration of 4.1 g/liter. This solution plates a thin layer of gold at a rate of 0.02 $\mu$m/min at 70° C. by partial displacement of the nickel layer. The mentioned solution is available commercially under the product name Oromerse SO, from Technic, Inc., of Cranston, R.I.

Oromerse SO comes in two parts (A and B), which are mixed together before use. To prepare a 1000 ml solution, 934 ml of part A is mixed with 66 ml of part B. The solution is not diluted further with water.

The immersion gold layer acts as a seed layer for a subsequent autocatalytic gold deposition. Therefore, a thickness of 0.1–0.2 $\mu$m is sufficient. The maximum thickness achievable by immersion gold plating before the displacement reaction stops is 0.5 $\mu$m, which is enough for wire-bonding.

Figure 6:
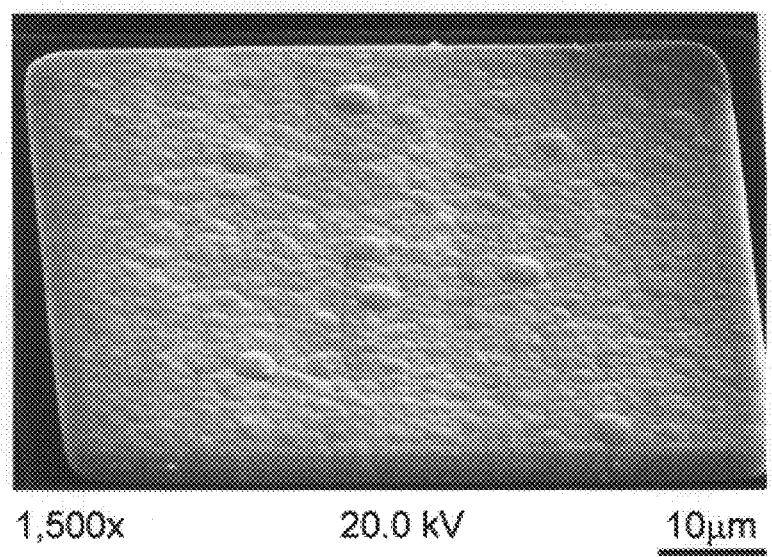
FIG. 6 illustrates a SEM image of bond pad after immersion gold plating (magnification 1,500×), according to embodiments of the invention.

FIG. 6 is an SEM photograph of immersion gold plated bond pad. FIG. 6 reveals that the texture of the immersion gold is almost exactly similar to that of the underlying nickel surface. However, the surface roughness range is wider at (350–700 Å).

In step 324, the semiconductor IC (and bond pads) are rinsed in de-ionized water.

3.5 Autocatalytic Gold Plating

In step 326, the thickness of the gold layer is increased using an autocatalytic gold plating process.

Immersion gold plating is often sufficient for flip-chip and wire-bonding. However, sometimes it is recommended to increase the thickness of the gold layer for ease of wire-bonding. For that, we use an additional re-metallization step, called autocatalytic gold plating, which ensures wire-bondability of the peripheral bond pads while maintaining the solderability of the bond pad array.

Autocatalytic plating is a relatively slow process (e.g. deposition rate of 1.0 $\mu$m/hour). Autocatalytic plating is sensitive to temperature, load factor of the plating bath, agitation, and the prior condition of the surface to be plated. If the immersion gold surface is oxidized, the subsequent autocatalytic gold deposit suffers from exfoliation or peeling.

In embodiments, a pH neutral non-cyanide based solution is utilized for the autocatalytic gold plating solution. More specifically, Neorum TWB is utilized as the autocatalytic gold plating solution, which is obtainable from Uyemura International Corporation, Ontario, Canada. Other solutions could be utilized as will be understood by those skilled in the arts based on the discussion herein.

Neorum TWB comes in three separate parts, namely: Neorum TWB-1M, Neorum TWB-1S, and Neorum gold solution. A 1.0 liter plating bath is prepared by mixing together the following: 915 ml of Neorum TWB-1M, 5 ml of Neorum TWB-1S, 51.4 ml of Neorum gold, and 28.6 ml of de-ionized water. The combined solution has sodium sulfite in it. The sodium sulfite reduces metallic gold from the electroless bath, which contains organic and inorganic salts of gold (gold concentration 3.5–4.5 g/lit), along with additives and complexing agents. In embodiments, a 1.0 $\mu$m thick layer of autocatalytic gold encapsulates the entire bond pad giving it a mushroom shape rather than a rectangular shape with vertical side-walls. The roughness of the surface after the final coating of autocatalytic gold is 250–350 Å.

Figure 7:
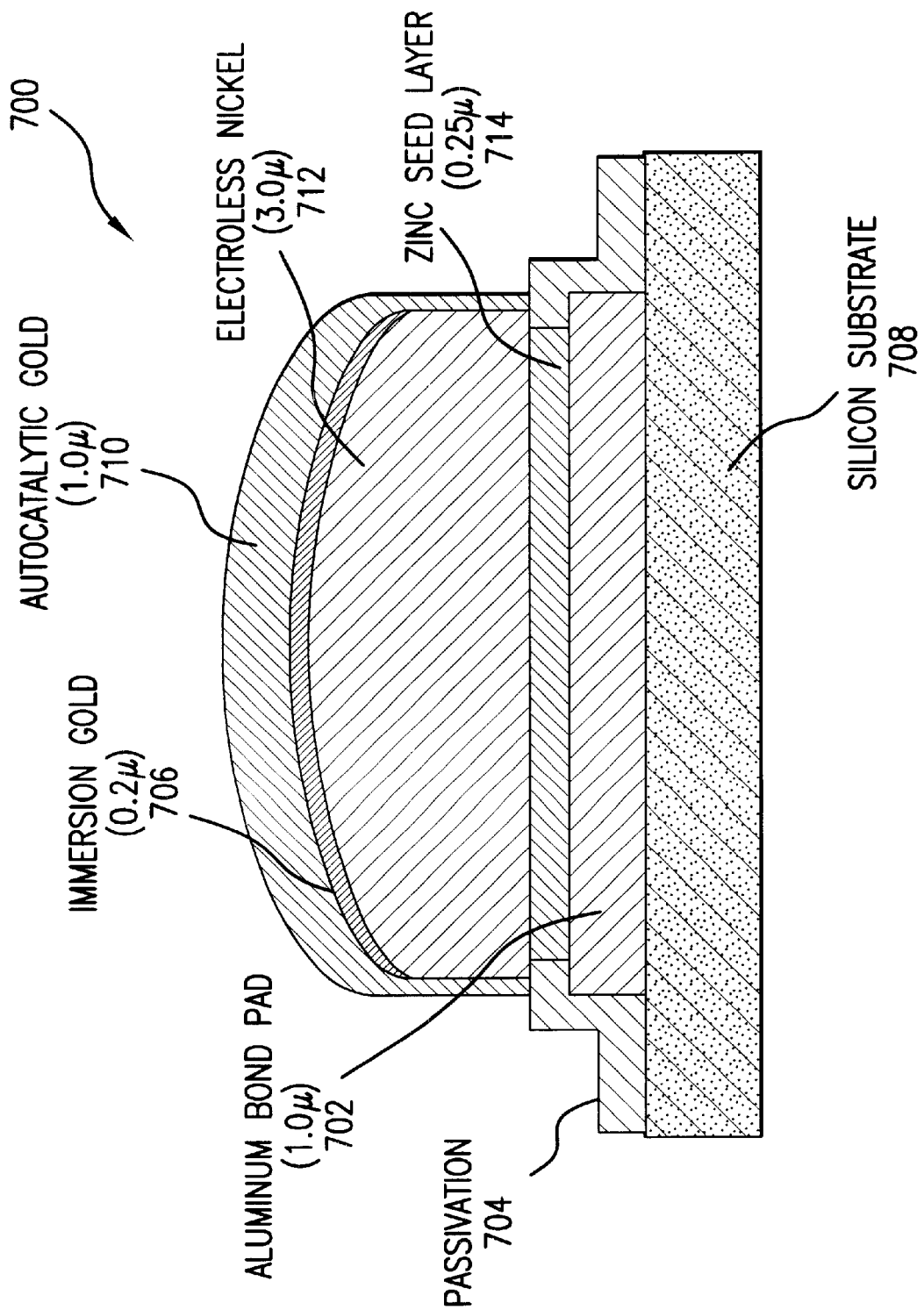
FIG. 7 illustrates a cross section diagram of a electrolessly re-metallized bond pad showing the different layers of re-metallization on aluminum, according to embodiments of the present invention.

FIG. 7 illustrates the resulting re-metallized bond pad 700 after completing the re-metallization process 300. The re-metallized bond pad 700 includes: the original aluminum bond pad 702 on a silicon substrate 708, a zinc layer 714 on top of the aluminum bond pad 702, an electroless nickel layer 712 on top of the zinc layer 714, an immersion gold layer 706 on top of the electroless nickel layer 712, and an autocatalytic gold layer 710 on top of the immersion gold layer 706. The layer thicknesses that are illustrated in FIG. 7 are for example purposes only and are not meant to be limiting. Other layer thickness could be chosen without changing the scope and spirit of the invention, as will be understood by those skilled in the relevant arts based on the discussion herein.

The re-metallizing process 300 is a low-cost technique for re-metallizing aluminum bond pads based on electroless plating. The process is low cost because the electroless plating solutions that are mentioned in the process are readily available in the commercial market. Additionally, the number of steps in the process cycle has been reduced by selecting an advantageous combination of chemical reagents for the steps. Potentially hazardous steps, like cyanide zinc pre-treatment and cyanide autocatalytic gold plating have been replaced by benign alternative processes.

As discussed herein, the re-metallization process 300 is relevant to the processing and packaging of electronic and optoelectronic devices. However, the process 300 is not limited to these applications. The re-metallization process can also be employed for solder attachment of fibers to waveguides, and the fabrication of under-bump-metallurgy for solder bumps. Additionally, the process is relevant to applications in various other industries such as: aerospace, automobiles, portable communication systems etc. Also, the re-metallization scheme for aluminum can be extended to other systems of electroless metal deposition, e.g. platinum, palladium, etc. These other process and applications will be apparent to those skilled in the arts based in the discussion herein, and are within the scope and spirit of the invention.

4.0 Variation in Surface Roughness

Figure 8:
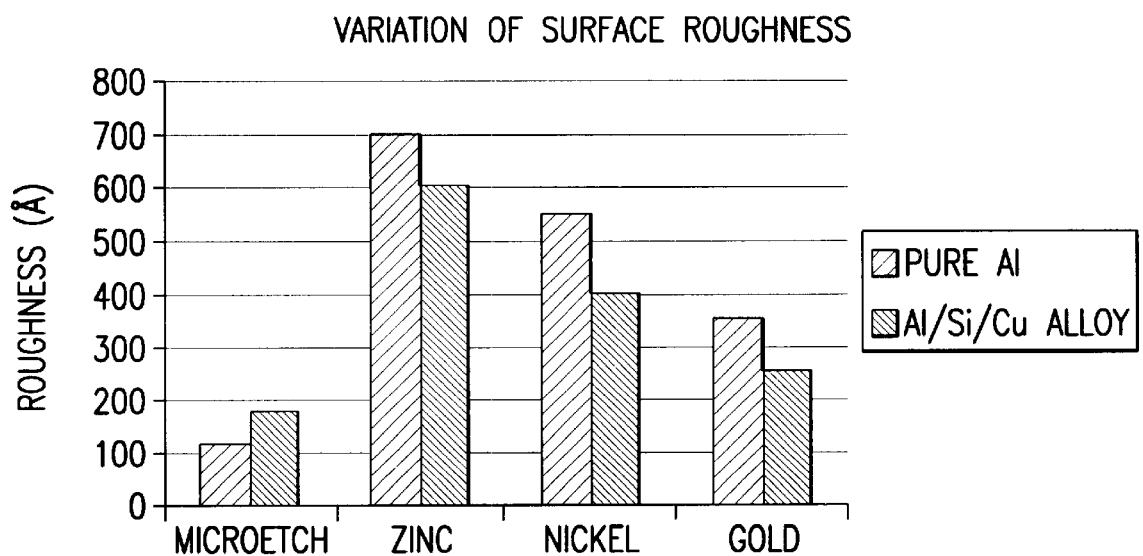
FIG. 8 illustrates a comparison of the variation of surface roughness during the electroless re-metallization process on chemically pure aluminum and Al/Si/Cu alloy, according to embodiments of the present invention.

The roughness of the bond pad surface at the different stages of the re-metallization process has been measured. The adhesion of a metal layer to its preceding layer is strongly influenced by the roughness of the surface. Since re-metallization involves multiple metal layers, adhesion strength at each interface has a significant contribution to the overall robustness of the re-metallized bond pad. The histogram in FIG. 8 depicts the variation of roughness for chemically pure aluminum and Al/Si/Cu alloy.

5.0 Size and Pitch of the Re-Metallized Bond Pads

Figure 9:
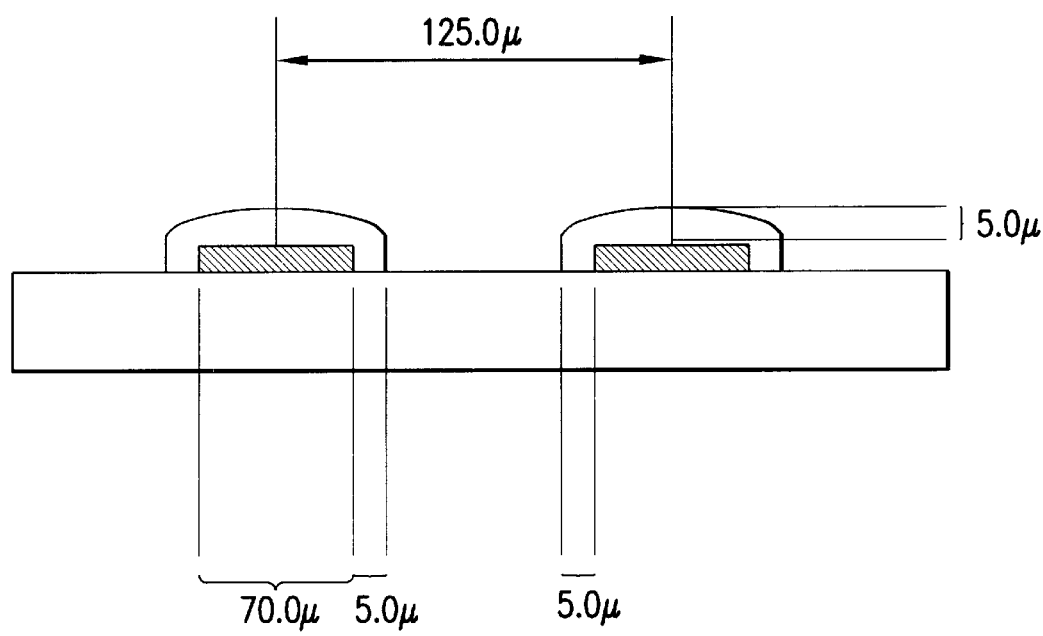
FIG. 9 illustrates a diagram of the lateral spreading of re-metallized bond pads having a mushroom shape on a CMOS chip, according to embodiments of the present invention.

The re-metallized bond pads expand laterally during the re-metallization process in addition to increasing in thickness. Therefore, the re-metallized bond pads have a mushroom shape, as illustrated in FIG. 9. The mushroom shape is attributable to the absence of any photoresist mask during the electroless deposition processes. Because of the lateral expansion, the pitch between the individual array elements becomes an important factor. To prevent short-circuiting of two adjacent pads, the gap between them should be greater than twice the vertical re-metallization height. In the example of FIG. 9, the thickness of the metal deposit is 5.0 $\mu$m, and the array pitch is 125 $\mu$m. Each flip-chip bond pad on a MOSIS chip NF8Y-AF is approximately 70×70 $\mu m^2$. Hence, the lateral gap between two adjacent pads is (125−70)=55 $\mu$m, which is well above the maximum lateral growth of 10 $\mu$m.

It has been experimentally verified that if there is sufficient gap for allowing lateral spreading, then the thickness obtained from electroless process is independent of the individual size and shape of the bond pads for dimensions on the order of 50 $\mu$m or larger. However, when the same process was applied on circular bond pads with 20 $\mu$m diameter, uniform bump height over the whole area array was achieved, but the thickness of the metallization was less than what is expected for 50 $\mu$m or larger bond pads. Also, it has been observed that the coating of the ground pads improves significantly if the backside of the CMOS chip is insulated.

6.0 Reproducibility of the Process

The re-metallization has been successfully tested on e-beam deposited pure aluminum and sputtered aluminum alloy without any modification to the process cycle. The yield was approximately 100% on the sputtered aluminum alloy (as used MOSIS chips). As mentioned, the testing was also successful for the pure aluminum. Hence, the process is universally applicable to all kinds of aluminum substrates.

7.0. Hybrid Packaging: Experiments and Results

As mentioned herein, the semiconductor ICs with the re-metallized bond pads are likely to be assembled into hybrid packages with other electronic and/or optoelectronic components. In the sections 7.1–7.4, tests and configurations related to the hybrid assembly are discussed, including wire-bonding and ball shear testing, and flip-chip bonding.

7.1 Wire-bonding and Ball Shear Test

Gold wire-bonds on a gold-coated surface is the best condition for reliable wire-bonding. Wire-bondability of the re-metallized bond pads was tested on many samples and the resulting yield was 100%. Ball bonds were made on the re-metallized surface using a 0.8 mil(~20.0 $\mu$m) gold wire at a fixed stage temperature of 135° C. The average destructive ball shear force measured by a DAGE2400 shear tester was approximately 100 gm. The shear occurred along the interface between the base of the gold ball and the autocatalytic gold layer, which proves that the deposited metal layers are well-adherent to each other.

7.2 Flip-Chip Bonding

A VCSEL device with solder bumps was flip-chip bonded to a re-metallized CMOS driver chip (as shown in FIG. 2), using a commercial flip-chip aligner/bonder M-8A (from Research Devices, NJ). With proper calibration, the alignment accuracy achievable by the M-8A machine is better than 2.0 $\mu$m.

The "tack and reflow" technique for solder bonding was used and is described as follows. After the VCSEL die and CMOS substrate are optically aligned, the solder bumps are tacked to the re-metallized bond pads with simultaneous application of temperature (below the melting point of the solder) and pressure. After tacking, the solder is reflowed at a temperature above its melting point to form mechanical and electrical interconnections between the two chips. This technique takes advantage of the self-aligning property of the molten solder.

Figure 10:
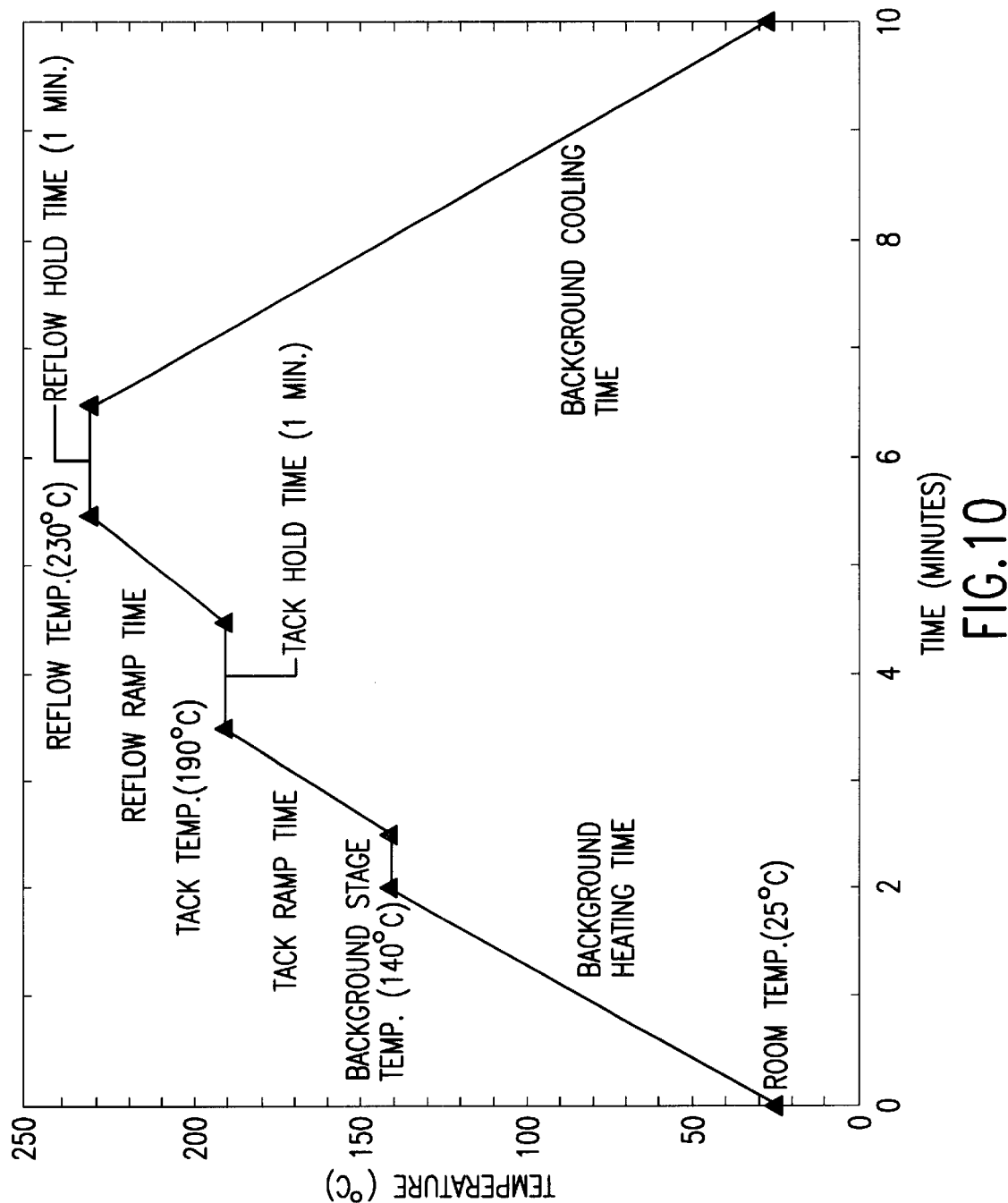
FIG. 10. illustrates a profile of temperature variation during a "tack-and-reflow" process used for flip-chip bonding, according to embodiments of the present invention.

In embodiments, ductile solder (50wt % indium-50 wt % lead alloy) material was used to reduce the influence of shear strain that is caused by mismatches between the thermal expansion of the materials. Indium lead solder has an eutectic melting point of 207° C. Therefore, tacking was carried out at 190° C. with 6.0 MPa of pressure. Reflowing was carried out at 227° C. for 1 minute, and then cooled down gradually to room temperature. The temperature profile used during the flip-chip solder process is shown in FIG. 10.

A daisy-chained configuration of solder bumps and bond pad array was used to verify the continuity of the electrical path after flip-chip bonding. The resistance between two electrically isolated bond pads, which where connected only by a flip-chip bonded solder bump, was measured with a multimeter. If an open circuit was measured, it would mean that the bonding process had failed to connect the two bond pads on the CMOS chip. No open circuits were found. The average resistance per solder joint was 0.39 ohm.

Figure 11:
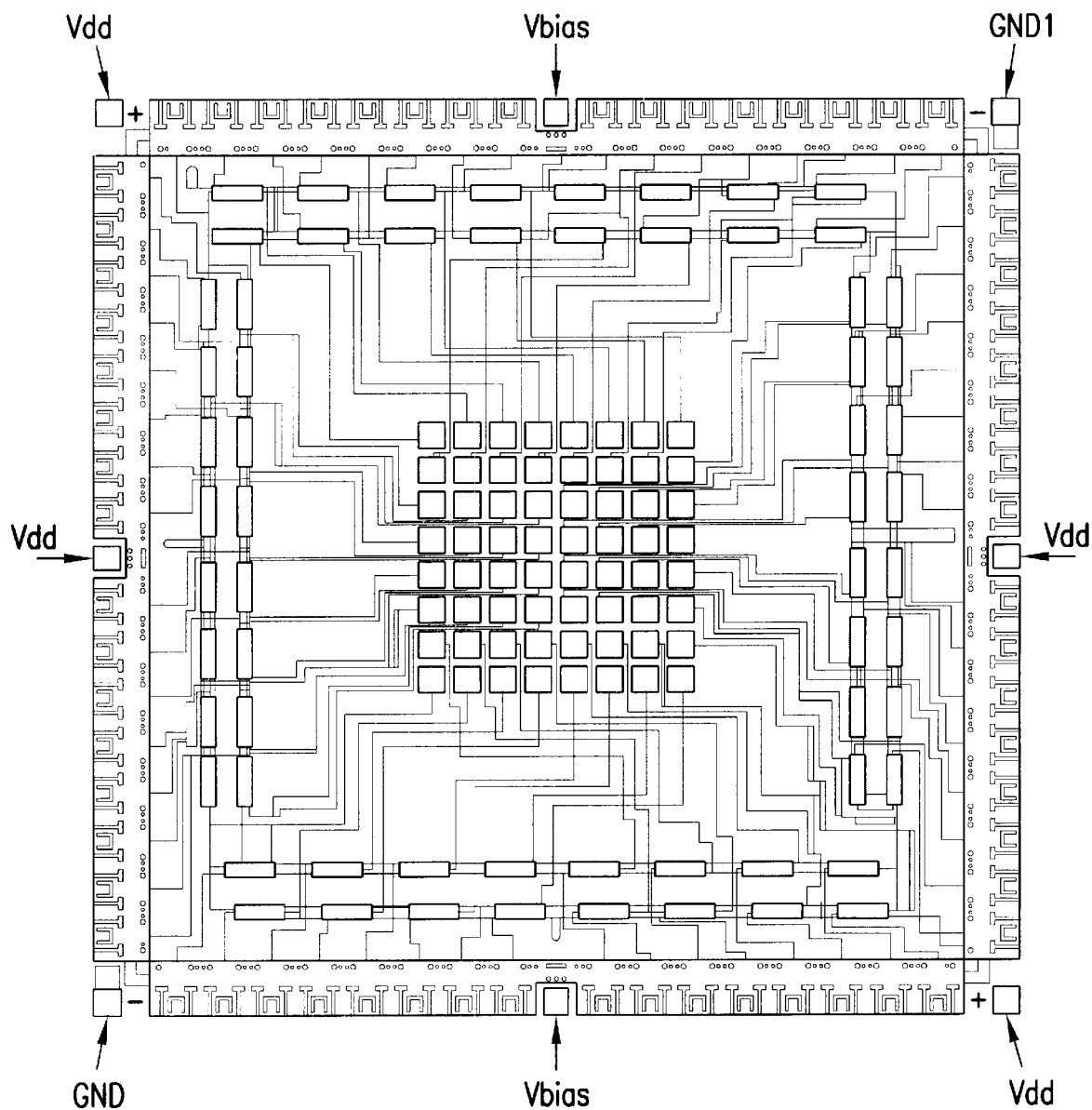
FIG. 11 illustrates a layout of a CMOS driver chip (MOSIS N84CAG) for a 125 μm pitch 8×8 VCSEL array.

FIG. 11 illustrates the layout of the 8×8 CMOS driver chip N84CAG. A VCSEL die with a similar bond pattern has been successfully flip-chip bonded onto the CMOS driver chip. This flip-chip bonded pair has been modularized in a PGA package and successfully tested for laser emission, which proves the feasibility of the electroless re-metallization process and flip-chip bonding for hybrid integration.

Additionally, the electroless plating is a scalable process, as it can be applied on bigger arrays of bond pads, including 16×16 and 24×24 bond pad arrays.

7.3 Cross Section of the Solder Joint

Figure 12:
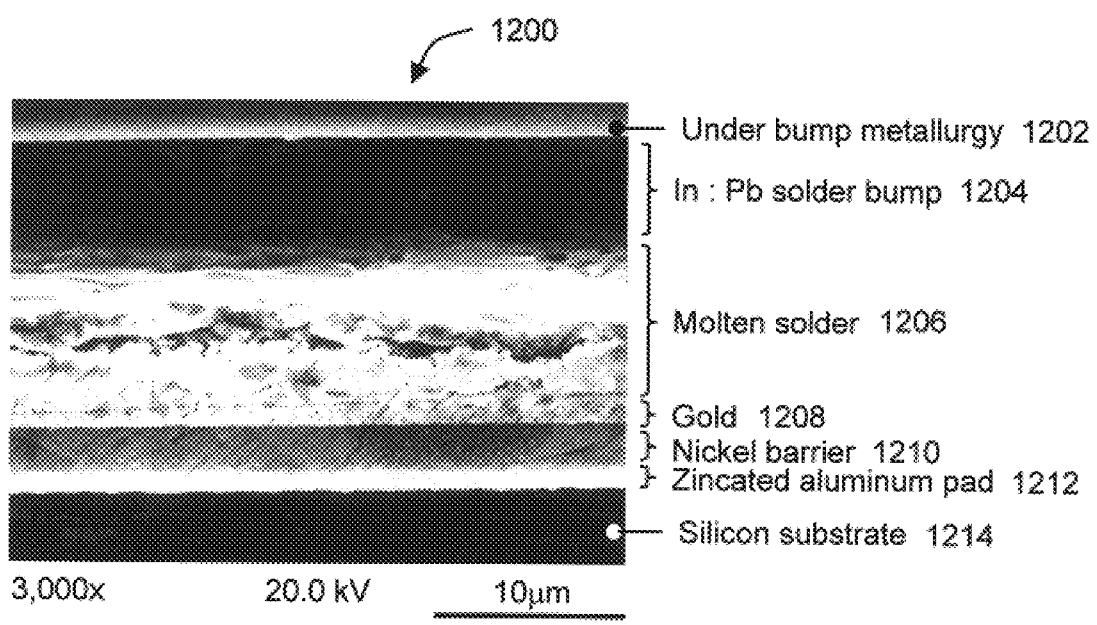
FIG. 12 illustrates a SEM image of a cross section of a solder joint after flip-chip bonding, according to embodiments of the present invention.

FIG. 12 illustrates an SEM image 1200 of a solder joint produced by flip-chip bonding a re-metallized bond pad. Image 1200 illustrates the different metal layers resulting from re-metallization and solder bonding including: an under-bump metal 1202, an indium lead solder bump layer 1204, a molten solder layer 1206, a gold layer 1208, nickel barrier layer 1210, a zincated aluminum pad layer 1212, and a silicon substrate layer 1214.

Image 1200 clearly shows that the molten solder layer 1206 has wetted the metal deposit on the aluminum bond pad 1212. This illustrates that the aluminum bond pad is successfully re-metallized into a solderable gold surface by the electroless process described herein. Additionally, since the seed layer of zinc is ultra-thin and mostly displaced by subsequent nickel layer 1210, it is not distinguishable in the picture. However, the nickel barrier layer 1210 is easily recognized.

7.4 Packaging of the Hybrid Pair

As further proof concept for hybrid assembly, a CMOS substrate with a VCSEL die flip-chip bonded on top of it was attached to a 14-pin butterfly package with conductive silver-epoxy. The peripheral. bond pads on the CMOS chip were connected to contact pads on the butterfly package by wire-bonding.

CONCLUSION

Example embodiments of the methods and components of the present invention have been described herein. As noted elsewhere, these example embodiments have been described for illustrative purposes only, and are not limiting. Other embodiments are possible and are covered by the invention. Such other embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

What is claimed is:

1. A re-metallized aluminum-based contact on a semiconductor (IC), comprising:

an aluminum layer;

a zinc layer that is adjacent a top surface of said aluminum layer, wherein said zinc layer has a maximum grain size of approximately 0.1 um;

a nickel layer that is adjacent a top surface of said zinc layer; and a gold layer that is adjacent a top surface of said nickel layer.

2. The re-metallized aluminum-based contact of claim 1, wherein said zinc layer is deposited using a zincate solution having an approximate temperature of 38–42 degrees C.

3. The re-metallized aluminum-based contact of claim 1, wherein said zinc layer is deposited using a zincate solution having an approximate temperature of 40 degrees C.

* * * * *